(12) United States Patent
Koizumi et al.

(10) Patent No.: US 8,890,199 B2
(45) Date of Patent: Nov. 18, 2014

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Hiroshi Koizumi, Kanagawa-ken (JP); Tomomichi Naka, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/027,668

(22) Filed: Sep. 16, 2013

(65) Prior Publication Data
US 2014/0252389 A1 Sep. 11, 2014

(30) Foreign Application Priority Data
Mar. 5, 2013 (JP) ................................. 2013-043254

(51) Int. Cl.
*H01L 33/50* (2010.01)
*H01L 33/58* (2010.01)
*H01L 33/00* (2010.01)

(52) U.S. Cl.
CPC .............. *H01L 33/58* (2013.01); *H01L 33/005* (2013.01); *H01L 33/504* (2013.01)
USPC .... 257/98; 257/79; 257/E33.06; 257/E33.061

(58) Field of Classification Search
USPC ........... 257/79, 98, E33.06, E33.061; 438/22, 438/25, 26, 27, 29
See application file for complete search history.

(56) References Cited

U.S. PATENT DOCUMENTS

| 8,329,482 B2 | 12/2012 | Yao et al. | |
|---|---|---|---|
| 2010/0006880 A1* | 1/2010 | Wang et al. | 257/98 |
| 2010/0276712 A1* | 11/2010 | Shaikevitch et al. | 257/98 |
| 2011/0266560 A1* | 11/2011 | Yao et al. | 257/88 |
| 2011/0297987 A1 | 12/2011 | Koizumi et al. | |
| 2013/0240931 A1* | 9/2013 | Akimoto et al. | 257/98 |
| 2014/0017829 A1* | 1/2014 | Miki et al. | 438/27 |

FOREIGN PATENT DOCUMENTS

| JP | 2010-114217 | 5/2010 |
|---|---|---|
| JP | 2010-114217 A | 5/2010 |

OTHER PUBLICATIONS

U.S. Appl. No. 14/174,574, filed Feb. 6, 2014, Koizumi, et al.

* cited by examiner

*Primary Examiner* — Eduardo A Rodela
(74) *Attorney, Agent, or Firm* — Oblon, Spivak, McClelland, Maier & Neustadt, L.L.P.

(57) ABSTRACT

According to one embodiment, a method for manufacturing a semiconductor light emitting device is disclosed. The method can include applying a resin liquid onto a first major surface of a workpiece. The workpiece has the first major surface and includes a plurality of element units and a resin layer holding the plurality of element units. The method causes the particles in the resin liquid to sink and forms a first region on a surface side of the resin liquid and a second region provided between the first region and the workpiece. The method raises a temperature of the workpiece to a second temperature higher than the first temperature to cure the resin liquid to form an optical layer including a first portion and a second portion. In addition, the method divides the optical layer and the resin layer for the plurality of element units.

18 Claims, 7 Drawing Sheets

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from Japanese Patent Application No. 2013-043254, filed on Mar. 5, 2013; the entire contents of which are incorporated herein by reference.

FIELD

Embodiments described herein relate generally to a semiconductor light emitting device and a method for manufacturing the same.

BACKGROUND

There is a semiconductor light emitting device that emits white light by combining a semiconductor light emitting element such as a blue LED (light emitting diode) and a resin including a fluorescent body, for example. For such a semiconductor light emitting device, it is required to improve light emission properties such as the uniformity of color and the light emission efficiency and achieve high productivity.

DETAILED DESCRIPTION

According to one embodiment, a method for manufacturing a semiconductor light emitting device is disclosed. The method can include applying a resin liquid onto a first major surface of a workpiece. The workpiece has the first major surface and includes a plurality of element units aligned in a plane parallel to the first major surface and a resin layer holding the plurality of element units. Each of the plurality of element units includes a conductive first columnar unit extending in a first direction perpendicular to the first major surface, a conductive second columnar unit provided apart from the first columnar unit in a second direction parallel to the first major surface and extending in the first direction, and a light emitting unit. The light emitting unit includes a first semiconductor layer of a first conductivity type including a first semiconductor portion opposed to at least part of the first columnar unit and a second semiconductor portion opposed to at least part of the second columnar unit, a second semiconductor layer of a second conductivity type provided between the second columnar unit and the second semiconductor portion, and a light emitting layer provided between the second semiconductor portion and the second semiconductor layer. The resin liquid includes a light transmissive resin and a plurality of particles dispersed in the light transmissive resin and is configured to absorb at least part of a first light emitted from the light emitting layer and to emit a second light of a wavelength different from a wavelength of the first light. The method can include causing the plurality of particles in the resin liquid to sink while keeping a state where a temperature of the workpiece on which the resin liquid is applied is raised to a first temperature and forming a first region on a surface side of the resin liquid and a second region provided between the first region and the workpiece and including the particle in a concentration higher than a concentration of the particle in the first region. The method can include raising a temperature of the workpiece on which the first region and the second region are formed to a second temperature higher than the first temperature to cure the resin liquid to form an optical layer including a first portion and a second portion. The first portion is formed from the first region, the second portion is formed from the second region and includes the particle at a concentration higher than a concentration of the particle in the first portion. There is no seam between the first portion and the second portion. In addition, the method can include dividing the optical layer and the resin layer for the plurality of element units.

According to one embodiment, a method for manufacturing a semiconductor light emitting device is disclosed. The method can include disposing a structure body on a first major surface of a workpiece, the structure body lying along an edge of the first major surface. The workpiece has the first major surface and includes a plurality of element units aligned in a plane parallel to the first major surface and a resin layer holding the plurality of element units. Each of the plurality of element units includes a conductive first columnar unit extending in a first direction perpendicular to the first major surface, a conductive second columnar unit provided apart from the first columnar unit in a second direction parallel to the first major surface and extending in the first direction, and a light emitting unit. The light emitting unit includes a first semiconductor layer of a first conductivity type including a first semiconductor portion opposed to at least part of the first columnar unit and a second semiconductor portion opposed to at least part of the second columnar unit, a second semiconductor layer of a second conductivity type provided between the second columnar unit and the second semiconductor portion, and a light emitting layer provided between the second semiconductor portion and the second semiconductor layer. The method can include applying a resin liquid onto a region surrounded by the structure body of the first major surface. The resin liquid includes a light transmissive resin and a plurality of particles dispersed in the light transmissive resin and is configured to absorb at least part of a first light emitted from the light emitting layer and to emit a second light of a wavelength different from a wavelength of the first light. The method can include applying centrifugal force to the workpiece on which the resin liquid is applied and changing a distribution of the plurality of particles in the resin liquid to form a first region on a surface side of the resin liquid and a second region provided between the first region and the workpiece and including the particle at a concentration higher than a concentration of the particle in the first region. The method can include curing the resin liquid to form an optical layer including a first portion and a second portion, the first portion being formed from the first region. The second portion is formed from the second region and includes the particle at a concentration higher than a concentration of the particle in the first portion, there being no seam between the first portion and the second portion. In addition, the method can include dividing the optical layer and the resin layer for the plurality of element units.

According to one embodiment, a semiconductor light emitting device includes a conductive first columnar unit, a conductive second columnar unit, an optical layer and a light emitting unit and a resin unit. The conductive first columnar unit extends in a first direction. The conductive second columnar unit is provided apart from the first columnar unit in a second direction crossing the first direction and extending in the first direction. The optical layer is provided apart from the first columnar unit and the second columnar unit in the first direction. The light emitting unit includes a first semiconductor layer of a first conductivity type, a second semiconductor layer of a second conductivity type and a light emitting layer. The first semiconductor layer includes a first semiconductor portion provided between at least part of the first columnar unit and the optical layer, and a second semiconductor portion provided between the second columnar unit and the optical layer. The second semiconductor layer of a second conductivity type is provided between the second columnar unit and the second semiconductor portion. The light emitting layer is provided between the second semiconductor portion and the second semiconductor layer. The resin unit covers a side surface along the first direction of the first columnar unit, a side surface along the first direction of the second columnar unit, a side surface of the light emitting unit, and a surface on a side of the first columnar unit and the second columnar unit of the light emitting unit. The optical layer includes a light transmissive resin and a plurality of particles dispersed in the light transmissive resin and is configured to absorb at least part of a first light emitted from the light emitting layer and to emit a second light of a wavelength different from a wavelength of the first light. The optical layer includes a first portion and a second portion provided between the first portion and the first semiconductor layer and includes the particle at a concentration higher than a concentration of the particle in the first portion. There is no seam between the first portion and the second portion.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1A:
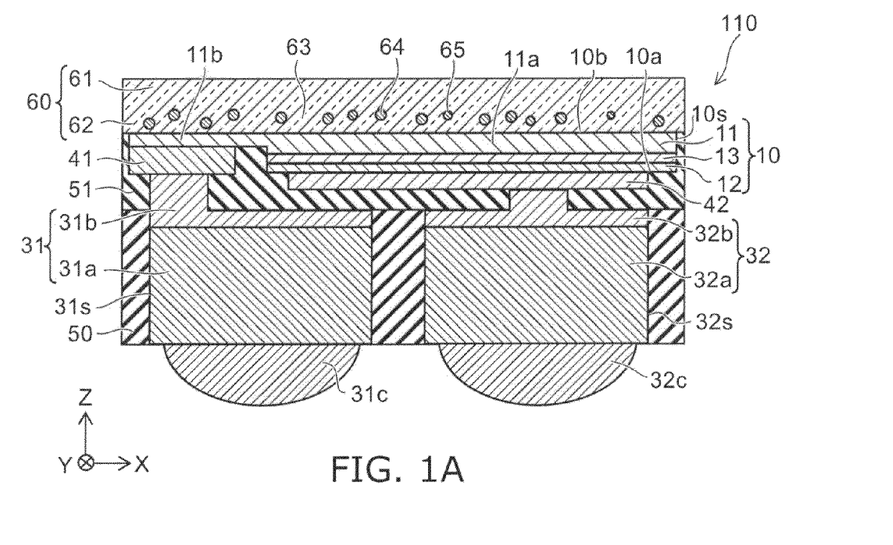
FIG. 1A and FIG. 1B are schematic diagrams illustrating a semiconductor light emitting device according to a first embodiment.
Figure 1B:
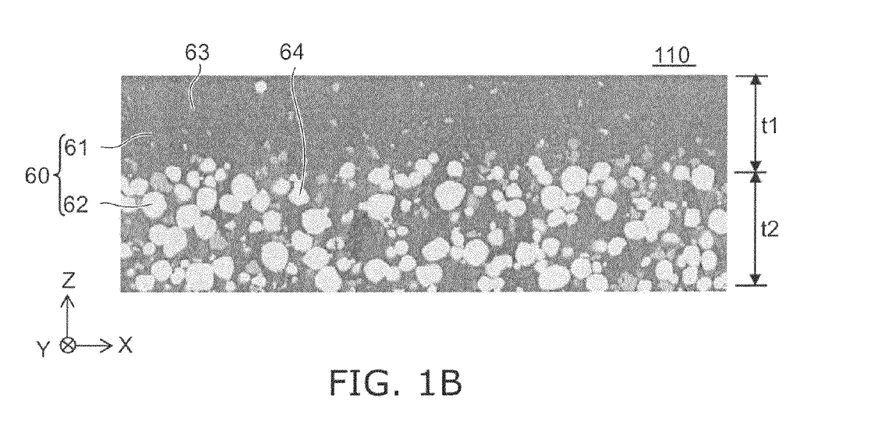

FIG. 1A and FIG. 1B are schematic diagrams illustrating a semiconductor light emitting device according to a first embodiment.

That is, FIG. 1A is a schematic cross-sectional view. FIG. 1B is an electron microscope image showing part of the semiconductor light emitting device.

As shown in FIG. 1A and FIG. 1B, a semiconductor light emitting device 110 according to the embodiment includes a first columnar unit 31, a second columnar unit 32, an optical layer 60, a light emitting unit 10, and a resin unit 50.

The first columnar unit 31 extends in a first direction, and is electrically conductive.

The first direction is taken as the Z-axis direction. One direction perpendicular to the first direction is taken as the X-axis direction. The direction perpendicular to the Z-axis direction and the X-axis direction is taken as the Y-axis direction.

The second columnar unit 32 is apart from the first columnar unit 31 in a second direction. The second columnar unit 32 extends in the Z-axis direction, and is electrically conductive. In this example, the second direction is the X-axis direction.

The optical layer 60 is apart from the first columnar unit 31 and the second columnar unit 32 in the Z-axis direction.

The light emitting unit 10 includes a first semiconductor layer 11 of a first conductivity type, a second semiconductor layer 12 of a second conductivity type, and a light emitting layer 13.

The first conductivity type is the n type, and the second conductivity type is the p type, for example. In the embodiment, the first conductivity type may be the p type, and the second conductivity type may be the n type. In the following examples, it is assumed that the first conductivity type is the n type and the second conductivity type is the p type.

The first semiconductor layer 11 includes a first semiconductor portion 11a and a second semiconductor portion 11b. The first semiconductor portion 11a is provided between at least part of the first columnar unit 31 and the optical layer 60. The second semiconductor portion 11b is provided between the second columnar unit 32 and the optical layer 60.

The second semiconductor layer 12 is provided between the second columnar unit 32 and the second semiconductor portion 11b. The light emitting layer 13 is provided between the second semiconductor portion 11b and the second semiconductor layer 12.

The first semiconductor layer 11, the second semiconductor layer 12, and the light emitting layer 13 include a nitride semiconductor, for example. The light emitting unit 10 has a side surface 10s. The side surface 10s of the light emitting unit 10 is a surface crossing the X-Y plane (the plane perpendicular to the first direction). The light emitting unit 10 has a surface on the side of the first columnar unit 31 and the second columnar unit 32 (a first surface 10a) and a surface on the side of the optical layer 60 (a second surface 10b).

The resin unit 50 covers a side surface 31s along the Z-axis direction of the first columnar unit 31, a side surface 32s along the Z-axis direction of the second columnar unit 32, and the side surface 10s of the light emitting unit 10. The resin unit 50 further covers a surface on the side of the first columnar unit 31 and the second columnar unit 32 of the light emitting unit 10 (the first surface 10a).

In this example, a first electrode 41 and a second electrode 42 are further provided. The first electrode 41 is in contact with the first semiconductor portion 11a between the first semiconductor portion 11a of the first semiconductor layer 11 and the first columnar unit 31. The second electrode 42 is in contact with the second semiconductor layer 12 between the second semiconductor layer 12 and the second columnar unit 32.

In this example, the first columnar unit 31 includes a first metal column 31a and a first metal layer 31b. The first metal layer 31b is disposed between the first metal column 31a and the first electrode 41. The first metal layer 31b is in contact with the first electrode 41. The second columnar unit 32 includes a second metal column 32a and a second metal layer 32b. The second metal layer 32b is disposed between the second metal column 32a and the second electrode 42. The second metal layer 32b is in contact with the second electrode 42.

In this example, an insulating layer 51 is further provided. The insulating layer 51 covers the first surface 10a of the light emitting unit 10. That is, the resin unit 50 covers the first surface 10a of the light emitting unit 10 via the insulating layer 51. The insulating layer 51 is provided between part of the first metal layer 31b and part of the second electrode 42. Thereby, the size of the first columnar unit 31 when cut along the X-Y plane is made larger than the size of the first electrode 41. That is, the thickness of the first columnar unit 31 is thick. Thereby, high thermal conductivity via the first columnar unit 31 is obtained.

In this example, a first connection member 31c and a second connection member 32c are further provided. The first columnar unit 31 is disposed between the first connection member 31c and the first electrode 41. The second columnar unit 32 is disposed between the second connection member 32c and the second electrode 42. A solder ball or the like is used as the first connection member 31c and the second connection member 32c, for example.

A current is supplied to the light emitting unit 10 via the first connection member 31c, the first columnar unit 31, the first electrode 41, the second connection member 32c, the second columnar unit 32, and the second electrode 42, and light (a first light) is emitted from the light emitting layer 13. The first light is blue light, for example.

The optical layer 60 includes a light transmissive resin 63 and a plurality of particles 64. The plurality of particles 64 are dispersed in the light transmissive resin 63. The plurality of particles 64 absorb at least part of the first light emitted from the light emitting layer 13, and emit a second light having a wavelength (e.g. a peak wavelength) different from the wavelength (e.g. the peak wavelength) of the first light. A second peak wavelength of the second light is longer than a first peak wavelength of the first light, for example. The first light is blue light, and the second light includes at least one of green light, yellow light, and red light, for example. Light in which the first light and the second light are mixed is white light, for example.

A fluorescent substance is used for the plurality of particles 64, for example. At least one of a silicone-based resin, an acrylic-based resin, and an epoxy-based resin is used for the light transmissive resin 63, for example.

The optical layer 60 may further include a plurality of fillers 65 dispersed in the light transmissive resin 63. At least one of silicon oxide, aluminum oxide, and titanium oxide may be used for the filler 65, for example.

FIG. 1B is a cross-sectional SEM (scanning electron microscope) image of part of the optical layer 60. As illustrated in FIG. 1B, in the embodiment, a concentration distribution of particles 64 is provided in the optical layer 60. That is, the concentration of particles 64 is high in a portion on the first semiconductor layer 11 side of the optical layer 60, and the concentration of particles 64 is low in a portion on the surface side of the optical layer 60.

That is, the optical layer 60 includes a first portion 61 and a second portion 62. The second portion 62 is provided between the first portion 61 and the first semiconductor layer 11. The second portion 62 includes particles 64 at a concentration higher than the concentration of particles 64 in the first portion 61.

The concentration of particles 64 in the first portion 61 is 5% or less, for example. There may be a portion of the first portion 61 where the concentration of particles 64 is substantially 0%. The concentration of particles 64 in the second portion 62 is not less than 40% and not more than 95%.

The thickness t1 of the first portion 61 is not less than 20 micrometers (μm) and not more than 100 μm, for example.

The thickness t2 of the second portion 62 is not less than 40 micrometers (μm) and not more than 200 μm, for example. The thickness t2 may be not less than 70 μm and not more than 80 μm, for example.

In the embodiment, there is no seam between the first portion 61 and the second portion 62. That is, the boundary is seamless.

Thereby, as described below, a semiconductor light emitting device with high light emission properties and high productivity can be provided.

Figure 2:
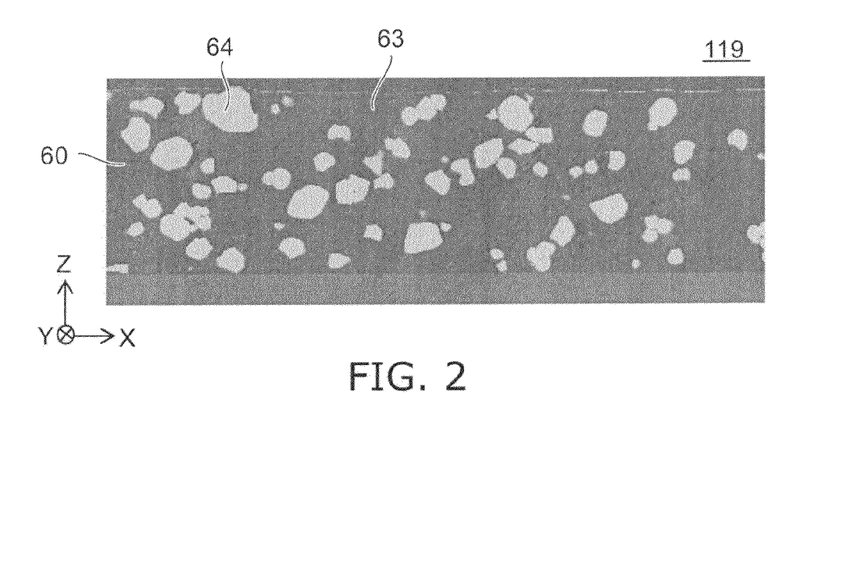
FIG. 2 is an electron microscope image illustrating a semiconductor light emitting device of a reference example.

FIG. 2 is an electron microscope image illustrating a semiconductor light emitting device of a reference example.

FIG. 2 is a cross-sectional SEM image of the optical layer 60 in a semiconductor light emitting device 119 of the reference example (the structure being not shown). As shown in FIG. 2, in the optical layer 60 in the reference example, the concentration of particles 64 is uniform and no concentration distribution is provided. The thickness of the entire optical layer 60 is almost the same as the thickness of the optical layer 60 of the semiconductor light emitting device 110 according to the embodiment.

In the semiconductor light emitting device 119 of the reference example, part of the particles 64 are exposed at the surface of the optical layer 60. Hence, the smoothness of the surface of the optical layer 60 is low. Therefore, in a manufacturing process in which the semiconductor light emitting device 119 is mounted on a mounting member, when the surface of the optical layer 60 is attracted by an attracting jig, it is likely that attraction will be insufficient and productivity will be reduced, for example.

In contrast, in the semiconductor light emitting device 110 according to the embodiment, particles 64 exist locally in the second portion 62 of the optical layer 60, and the concentration of particles 64 in the first portion 61 is low. Hence, the smoothness of the surface of the optical layer 60 is high. Thereby, in a manufacturing process in which the semiconductor light emitting device 110 is mounted on a mounting member, when the surface of the optical layer 60 is attracted, stable attraction can be performed to provide high productivity.

Furthermore, in the semiconductor light emitting device 119 of the reference example, particles 64 are dispersed in the entire optical layer 60 in the thickness direction. Thereby, as described below, a phenomenon in which color changes with the direction of light emission occurs.

Figure 3:
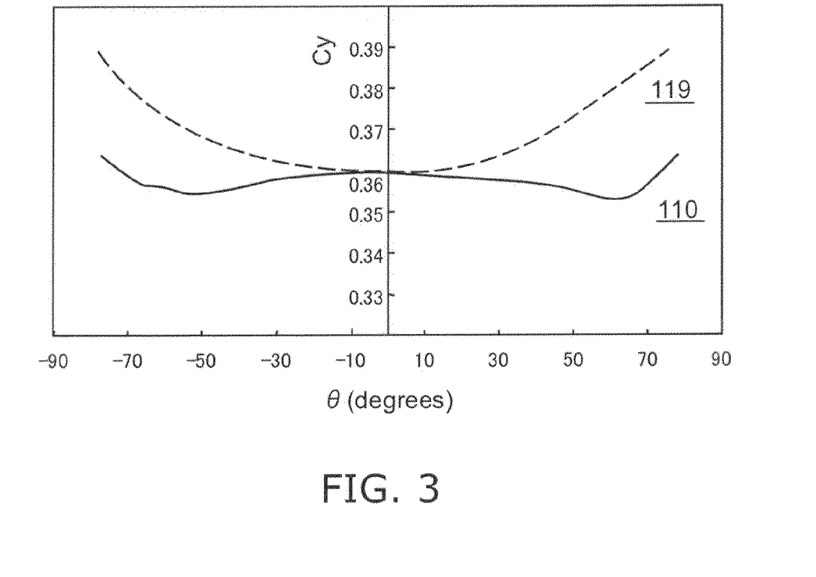
FIG. 3 is a graph illustrating characteristics of the semiconductor light emitting devices.

FIG. 3 is a graph illustrating characteristics of the semiconductor light emitting devices.

FIG. 3 illustrates the chromatic characteristics of light of the semiconductor light emitting devices 110 and 119 mentioned above. The horizontal axis is the angle θ (degrees) from the Z-axis direction. The vertical axis is the Y value Cy in CIE chromaticity coordinates. In this example, the first light is blue light, and the second light is yellow light.

As can be seen from FIG. 3, in the front direction (the angle θ being 0 degrees), white light is obtained in both the semiconductor light emitting devices. However, in regard to light with a large angle θ emitted obliquely, chromatic characteristics are greatly different between these semiconductor light emitting devices. That is, in the semiconductor light emitting device 119, yellow light is produced in an oblique direction. The phenomenon may be called a yellow ring. The phenomenon occurs due to the fact that the optical path in the region where particles 64 are dispersed becomes longer as the angle θ increases. The phenomenon is significant when particles 64 are dispersed over the entire optical layer 60 in the thickness direction and the region where particles 64 are dispersed is thick.

In contrast, as can be seen from FIG. 3, in the semiconductor light emitting device 110 according to the embodiment, the change in color is small even in an oblique direction with a large angle θ. That is, white light is obtained even in an oblique direction. The occurrence of the yellow ring is suppressed. Thus, the uniformity of color can be improved in the embodiment.

In the embodiment, the uniformity of color is more enhanced by setting the thickness t2 of the second portion 62 not less than 40 μm and not more than 200 μm. Furthermore, good brightness, good light emission efficiency, and uniformity of color are obtained satisfactorily by setting the thickness t2 not less than 70 μm and not more than 80 μm.

Another reference example like the following may be possible. That is, there is a configuration in which a fluorescent body layer with a high concentration of particles 64 is formed on the first semiconductor layer 11, and a resin layer with a low concentration of particles 64 (for example, including no particles 64) is formed on the fluorescent body layer; thus, the optical layer 60 is formed. In this case, the surface of the optical layer 60 can be made smooth. However, a seam is formed between the fluorescent body layer and the resin layer. In this case, light is reflected or absorbed at the seam (interface) between the fluorescent body layer and the resin layer to cause a loss of light. Consequently, the light extraction efficiency is low, and high light emission efficiency cannot be obtained.

In contrast, in the embodiment, there is no seam between the first portion 61 and the second portion 62, and the boundary is seamless. Thereby, the loss of light can be suppressed.

Thus, in the embodiment, since particles 64 exist locally in the second portion 62 and the surface of the optical layer 60 is smooth, high productivity is obtained. Furthermore, since the thickness t2 of the region where particles 64 are dispersed (the second portion 62) is thin, color unevenness such as the yellow ting can be suppressed, and the uniformity of color is high. By being seamless, the loss of light can be suppressed, and the light emission efficiency is high. The embodiment can provide a semiconductor light emitting device with high light emission properties and high productivity.

There is a configuration in which a semiconductor light emitting element is mounted in a cup-shaped mounting component and a fluorescent resin is applied onto the semiconductor light emitting element. In this case, light is reflected at the inner side wall of the cup-shaped mounting component and is emitted upward; therefore, the phenomenon of the yellow ring does not occur. The phenomenon of the yellow ring is a phenomenon that occurs uniquely in a configuration in which such a mounting component is not used.

Second Embodiment

The embodiment relates to a method for manufacturing the semiconductor light emitting device 110 according to the first embodiment. In the embodiment, gravity is used for the formation of the concentration distribution of particles 64.

Figure 4:
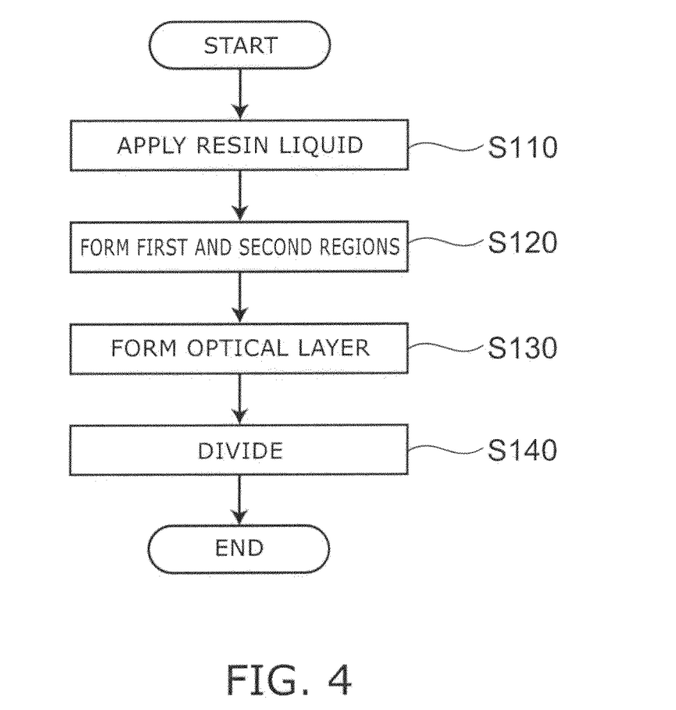
FIG. 4 is a flow chart illustrating a method for manufacturing a semiconductor light emitting device according to a second embodiment.

FIG. 4 is a flow chart illustrating a method for manufacturing a semiconductor light emitting device according to a second embodiment.

FIG. 5A to FIG. 5E are schematic cross-sectional views in order of the processes, illustrating the method for manufacturing the semiconductor light emitting device according to the second embodiment.

As shown in FIG. 4, in the manufacturing method, a resin liquid is applied onto a workpiece (step S110). The workpiece will now be described.

Figure 5A:
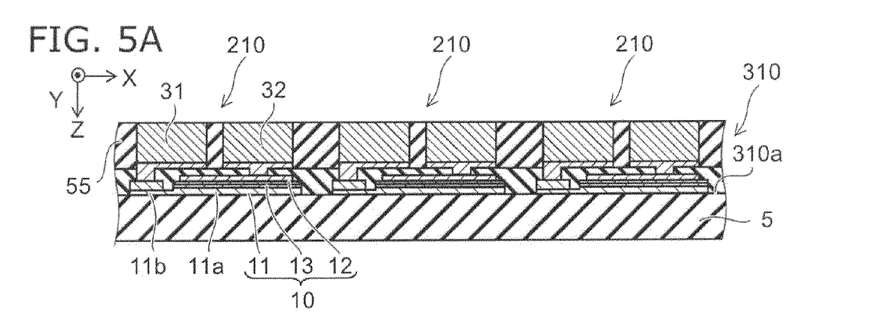
FIG. 5A to FIG. 5E are schematic cross-sectional views in order of the processes, illustrating the method for manufacturing the semiconductor light emitting device according to the second embodiment.

As shown in FIG. 5A, a semiconductor layer that forms the light emitting unit 10 is epitaxially grown on a growth substrate 5, the semiconductor layer is processed into a prescribed configuration, and the first columnar unit 31, the second columnar unit 32, and a resin layer 55 are formed, for example. Thereby, a plurality of element units 210 are formed. The growth substrate 5 is removed after the formation of the first columnar unit 31, the second columnar unit 32, and the resin layer 55. The portion from which the growth substrate 5 has been removed is taken as a workpiece 310. The workpiece 310 has a first major surface 310a. The first major surface 310a is the surface on the growth substrate 5 side.

Each of the plurality of element units 210 includes the conductive first columnar unit 31, the conductive second columnar unit 32, and the light emitting unit 10. The first columnar unit 31 extends in the first direction (e.g. the Z-axis direction). The first direction is perpendicular to the first major surface 310a. The second columnar unit 32 is apart from the first columnar unit 31 in the second direction (e.g. the X-axis direction), and extends in the first direction. The second direction is a direction parallel to the first major surface 310a, that is, a direction crossing the first direction.

The light emitting unit 10 includes the first semiconductor layer 11 of the first conductivity type, the second semiconductor layer 12 of the second conductivity type, and the light emitting layer 13. The first semiconductor layer 11 includes the first semiconductor portion 11a opposed to at least part of the first columnar unit 31 and the second semiconductor portion 11b opposed to at least part of the second columnar unit 32. The first semiconductor layer 11 is exposed at the first major surface 310a when the growth substrate 5 is removed. The second semiconductor layer 12 is provided between the second columnar unit 32 and the second semiconductor portion 11b, and the light emitting layer 13 is provided between the second semiconductor portion 11b and the second semiconductor layer 12.

The plurality of element units 210 thus configured are provided in the workpiece 310. That is, the workpiece 310 has the first major surface 310a, and includes the plurality of element units 210 aligned in a plane parallel to the first major surface 310a (the X-Y plane) and the resin layer 55 holding the plurality of element units 210. As described later, each of the plurality of element units 210 constitutes part of the semiconductor light emitting device 110. The resin layer 55 forms the resin unit 50 by being divided.

Figure 5B:
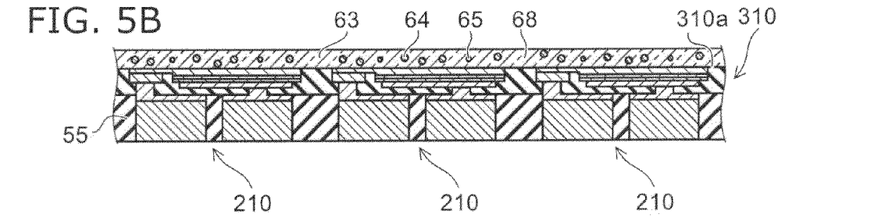

As shown in FIG. 5B, a resin liquid 68 is applied onto the first major surface 310a of the workpiece 310 thus configured. The resin liquid 68 includes the light transmissive resin 63 and a plurality of particles 64 dispersed in the light transmissive resin 63. The particle 64 absorbs at least part of the first light emitted from the light emitting layer 13 and emits the second light of a wavelength different from the wavelength of the first light. The resin liquid 68 may further include a plurality of fillers 65. When the resin liquid 68 is applied, the particles 64 are dispersed uniformly in the resin liquid 68.

If particles sink easily in the resin liquid 68 before application, the concentration of particles 64 in the resin liquid 68 will be non-uniform, and the concentration of particles 64 will be non-uniform when the resin liquid 68 is applied. Furthermore, in the manufacturing process, the concentration of particles 64 will be non-uniform between workpieces 310. Thus, it is preferable that particles sink less easily in the resin liquid 68 before application. Consequently, particles 64 are dispersed uniformly also in the resin liquid 68 immediately after application.

Figure 5C:
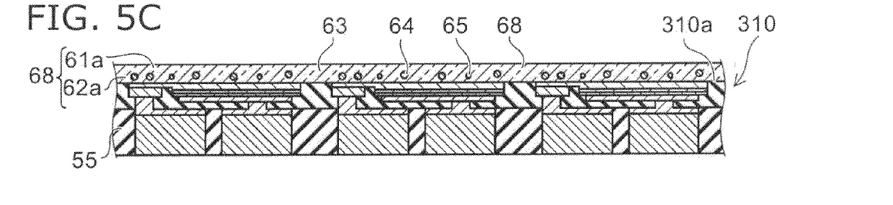

As shown in FIG. 4 and FIG. 5C, the plurality of particles 64 are caused to sink to form a first region 61a and a second region 62a (step S120). The first region 61a is a region on the surface side of the resin liquid 68. The second region 62a is a region provided between the first region 61a and the workpiece 310. The second region 62a includes particles 64 at a concentration higher than the concentration of particles 64 in the first region 61a.

In step S120, the plurality of particles 64 in the resin liquid 68 are caused to sink while keeping a state where the temperature of the workpiece 310 on which the resin liquid 68 is applied is raised to a first temperature, for example.

Figure 6:
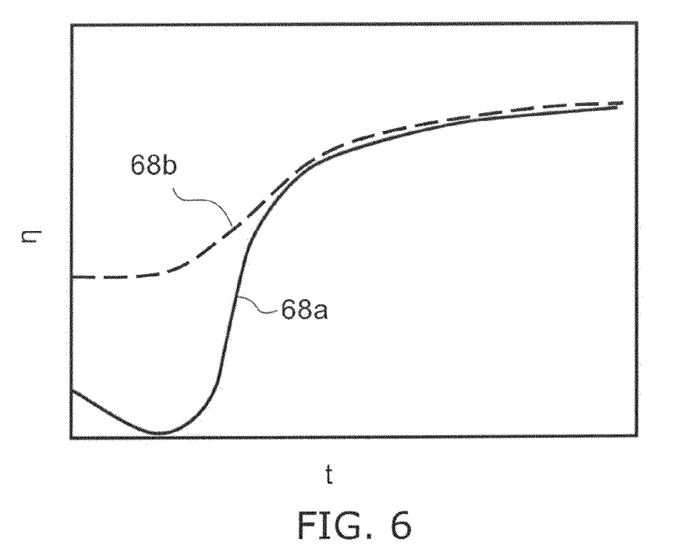
FIG. 6 is a graph illustrating properties of the material used for the method for manufacturing the semiconductor light emitting device.

FIG. 6 is a graph illustrating properties of the material used for the method for manufacturing the semiconductor light emitting device.

FIG. 6 illustrates properties of the resin liquid 68. In this example, properties of two kinds of resin liquids 68 are illustrated. A first resin 68a is the resin liquid 68 used for the embodiment. A second resin 68b is a resin liquid different from the first resin 68a. The horizontal axis is the holding time t at a prescribed temperature (the first temperature). The vertical axis is the viscosity η of the resin liquid. A thermosetting resin is used for the resin liquid.

As shown in FIG. 6, in the second resin 68b, when the temperature is kept at the prescribed temperature (the first temperature), the viscosity η increases monotonically as the holding time t elapses. This phenomenon corresponds to curing due to the heat of the resin.

In contrast, in the first resin 68a, as the holding time t at the prescribed temperature (the first temperature) elapses, the viscosity η decreases once and then increases. In the first resin 68a, as the holding time t elapses, the curing of the first resin 68a substantially does not proceed, and a decrease in the viscosity η at high temperature occurs. After the decrease in the viscosity η, the curing of the first resin 68a proceeds.

By using the resin liquid 68 (the first resin 68a) having such properties, the sedimentation of particles 64 in the resin liquid 68 can be performed in a short time.

In the case of using the second resin 68b, since curing proceeds when the temperature is raised to the prescribed temperature (the first temperature), the sedimentation of particles 64 is performed at low temperature at which curing does not proceed (e.g. room temperature), for example. For such sedimentation at low temperature, a time of approximately 24 hours is needed, for example.

In contrast, in the embodiment, by keeping at the prescribed temperature (the first temperature) higher than room temperature, the sedimentation of particles 64 is completed in a short time of approximately 0.5 hours to 5 hours, for example.

In this way, the first region 61a on the surface side of the resin liquid 68 and the second region 62a provided between the first region 61a and the workpiece 310 are formed. The second region 62a includes particles 64 at a concentration higher than the concentration of particles 64 in the first region 61a. The first region 61a with a low concentration of particles 64 and the second region 62a with a high concentration of particles 64 can be formed in a short time by using the first resin 68a, for example.

Figure 5D:
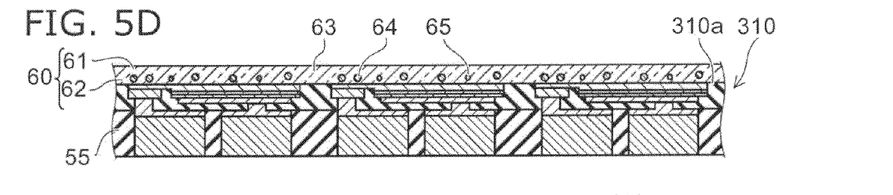

As shown in FIG. 4 and FIG. 5D, the temperature of the workpiece 310 on which the first region 61a and the second region 62a are formed is increased to a second temperature higher than the first temperature to cure the resin liquid 68; thus, the optical layer 60 is formed (step S130). The optical layer 60 includes the first portion 61 formed from the first region 61a and the second portion 62 formed from the second region 62a. The second portion 62 includes particles 64 at a concentration higher than the concentration of particles 64 in the first portion 61. There is no seam between the first portion 61 and the second portion 62, and the boundary is seamless.

Figure 5E:
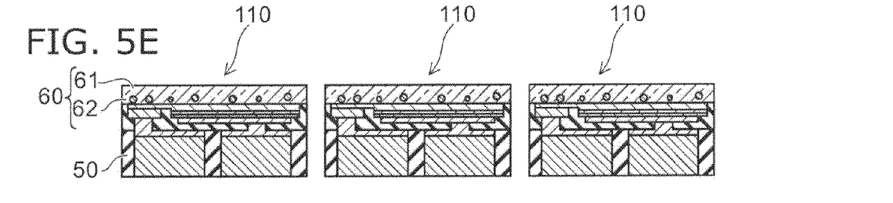

As shown in FIG. 4 and FIG. 5E, the optical layer 60 and the resin layer 55 are divided for the plurality of element units (step S140). The resin unit 50 is formed from the resin layer 55.

Thereby, a plurality of semiconductor light emitting devices 110 can be formed.

The embodiment can provide a method for manufacturing a semiconductor light emitting device with high light emission properties and high productivity. In the embodiment, semiconductor light emitting devices can be manufactured with high productivity by performing two-step processing of the sedimentation of particles 64 by keeping at the first temperature like the above and the curing of the resin liquid 68 at the second temperature higher than the first temperature.

As described above, the design is made such that particles sink less easily in the resin liquid 68 at room temperature, for example, before application. In the embodiment, the design is made such that the viscosity of the resin liquid 68 is high at the temperature in application (e.g. room temperature) and the viscosity of the resin liquid 68 is decreased at the first temperature of sedimentation performed after the application (a temperature higher than the temperature in the application). At the first temperature, the curing of the resin liquid 68 substantially does not proceed in the time until particles 64 sink. After the sedimentation, the curing of the resin liquid 68 is performed at the second temperature higher than the first temperature.

Thereby, the concentration of particles 64 can be obtained stably at the time of application, and sedimentation can be completed in a short time. A manufacturing method with high productivity can be provided.

Third Embodiment

The embodiment relates to another method for manufacturing the semiconductor light emitting device 110 according to the first embodiment. In the embodiment, centrifugal force is used for the formation of the concentration distribution of particles 64.

Figure 7:
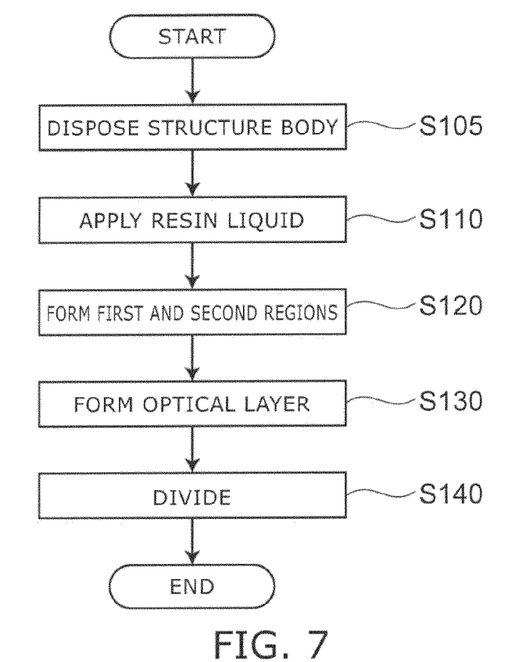
FIG. 7 is a flow chart illustrating a method for manufacturing a semiconductor light emitting device according to a third embodiment.

FIG. 7 is a flow chart illustrating a method for manufacturing a semiconductor light emitting device according to a third embodiment.

FIG. 8A to FIG. 8D are schematic cross-sectional views in order of the processes, illustrating the method for manufacturing the semiconductor light emitting device according to the third embodiment.

Figure 8A:
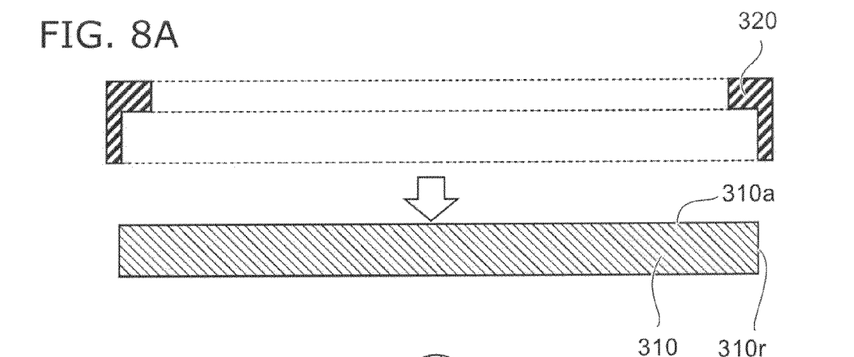
FIG. 8A to FIG. 8D are schematic cross-sectional views in order of the processes, illustrating the method for manufacturing the semiconductor light emitting device according to the third embodiment.
Figure 8B:
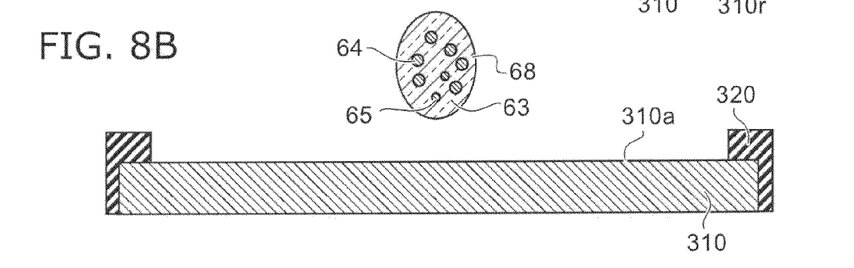

As shown in FIG. 7, FIG. 8A, and FIG. 8B, a structure body 320 lying along the edge 310r of the first major surface 310a is formed on the first major surface 310a of the workpiece 310

(step S105). The workpiece 310 is similar to that described in regard to the second embodiment, and a description is omitted.

In this example, a frame provided with an opening is used as the structure body 320. The frame is made to cover the workpiece 310. The portion excluding the edge 310r of the first major surface 310a of the workpiece 310 is exposed from the opening of the frame.

As shown in FIG. 7 and FIG. 8B, the resin liquid 68 is applied to the region surrounded by the structure body 320 of the first major surface 310a (step S110). The resin liquid 68 includes the light transmissive resin 63 and a plurality of particles 64 dispersed in the light transmissive resin 63. In this example, the resin liquid 68 further includes a plurality of fillers 65.

Figure 8C:
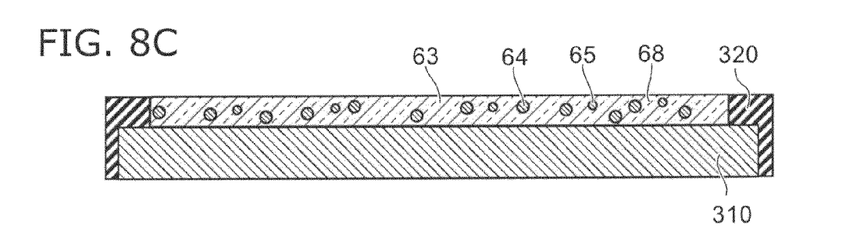

In this state, as shown in FIG. 8C, the particles 64 are dispersed uniformly in the resin liquid 68 applied. That is, no distribution is formed in the concentration of particles 64 in the resin liquid 68. The resin liquid 68 is designed such that particles 64 are dispersed uniformly in the resin liquid 68 immediately after application. Thereby, application with a uniform concentration of particles 64 can be performed, and also the concentrations of particles 64 in different workpieces 310 can be made uniform.

Figure 8D:
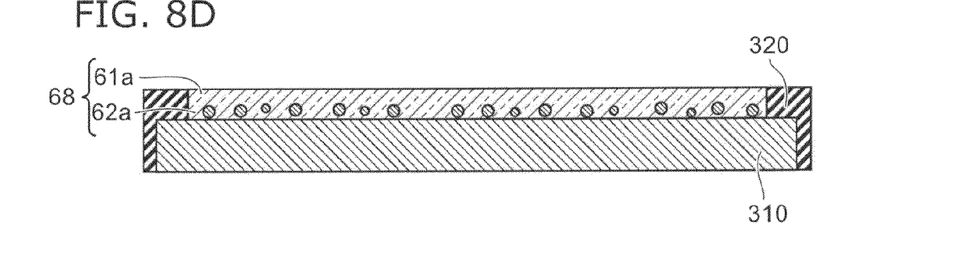

As shown in FIG. 7 and FIG. 8D, the first region 61a on the surface side of the resin liquid 68 and the second region 62a provided between the first region 61a and the workpiece 310 are formed (step S120). The second region 62a includes particles 64 at a concentration higher than the concentration of particles 64 in the first region 61a. In this example, centrifugal force is used for the formation of the first region 61a and the second region 62a. An object to be processed 340 including the resin liquid 68 applied on the region surrounded by the structure body 320, the workpiece 310, and the structure body 320 is rotated, and centrifugal force is applied to the object to be processed 340.

Figure 9:
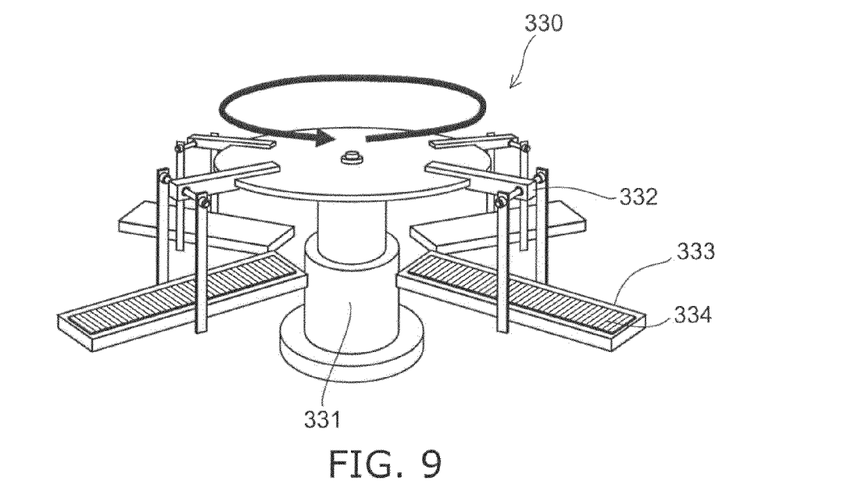
FIG. 9 is a schematic perspective view illustrating a processing apparatus used for the method for manufacturing the semiconductor light emitting device according to the third embodiment.

FIG. 9 is a schematic perspective view illustrating a processing apparatus used for the method for manufacturing the semiconductor light emitting device according to the third embodiment.

Figure 10:
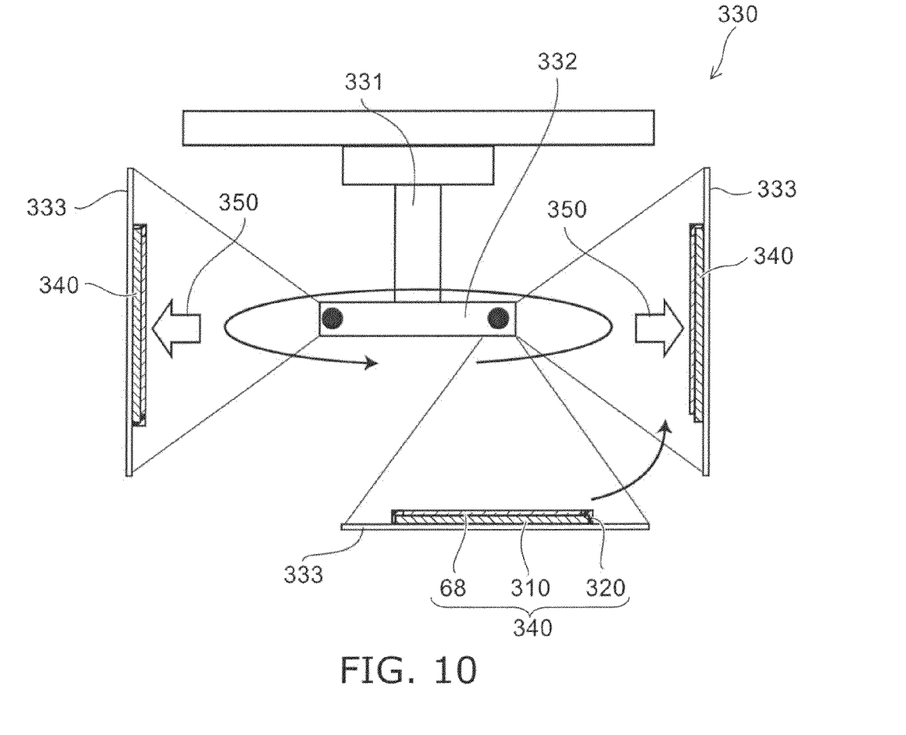
FIG. 10 is a schematic view illustrating operations of the processing apparatus used for the method for manufacturing the semiconductor light emitting device according to the third embodiment.

FIG. 10 is a schematic view illustrating operations of the processing apparatus used for the method for manufacturing the semiconductor light emitting device according to the third embodiment.

As shown in FIG. 9, a processing apparatus 330 includes a rotation unit 331, arms 332 extending radially from the rotation unit 331, and an object-to-be-processed mounting unit 333 held by the arm 332.

As shown in FIG. 10, the object to be processed 340 is placed on the object-to-be-processed mounting unit 333 in a state where the rotation unit 331 is not rotated. In this state, the object to be processed 340 (the first major surface 310a thereof) is in a horizontal state (perpendicular to the axis of the rotation unit 331). When the rotation unit 331 is rotated, the centrifugal force 350 produced by the rotation causes the object-to-be-processed mounting unit 333 and the object to be processed 340 to be nearly vertical (parallel to the axis of the rotation unit 331). The centrifugal force 350 due to the rotation acts on the resin liquid 68 of the object to be processed 340. Due to the centrifugal force 350, particles 64 move through the resin liquid 68 to form the first region 61a with a low concentration of particles 64 and the second region 62a with a high concentration of particles 64.

Thus, in this example, centrifugal force is applied to the workpiece 310 on which the resin liquid 68 is applied, and the distribution of the plurality of particles 64 in the resin liquid 68 is changed. Thereby, the first region 61a and the second region 62a mentioned above can be formed in a short time.

In this method, the range of the properties of the resin liquid 68 is expanded, for example. Since centrifugal force of a prescribed strength can be used for the formation of the concentration distribution of particles 64, a resin liquid 68 in which particles 64 move less easily can be used, for example. Thereby, the stability of the concentration of particles 64 in the resin liquid 68 before application is more enhanced, for example. Materials of a wider range of properties can be used also in terms of the change of viscosity to temperature. Thus, other properties (e.g. optical properties, reliability, processability, etc.) can be more enhanced, for example.

After the first region 61a and the second region 62a are formed in this way, as illustrated in FIG. 7, the resin liquid 68 is cured to form the optical layer 60 (step S130). That is, the processing described in regard to FIG. 5D is performed. The optical layer 60 includes the first portion 61 formed from the first region 61a and the second portion 62 formed from the second region 62a. Also in this case, the second portion 62 includes particles 64 at a concentration higher than the concentration of particles 64 in the first portion 61. There is no seam between the first portion 61 and the second portion 62, and the boundary is seamless.

After that, as shown in FIG. 7, the optical layer 60 and the resin layer 55 are divided for the plurality of element units 210 (step S140). That is, the processing described in regard to FIG. 5E is performed. Thereby, a plurality of semiconductor light emitting devices 110 can be formed.

The embodiment can provide a method for manufacturing a semiconductor light emitting device with high light emission properties and high productivity. In the embodiment, semiconductor light emitting devices can be manufactured with higher productivity by using centrifugal force. Furthermore, since materials of a wide range of properties can be used for the resin liquid 68, various properties can be improved more.

There may be a method in which a distribution is formed in the concentration of fluorescent particles in a fluorescent resin in a configuration in which a semiconductor light emitting element is mounted in a cup-shaped mounting component and the fluorescent resin is applied on the semiconductor light emitting element. In this configuration, it is difficult to equalize the thickness of the portion with a high concentration of fluorescent particles due to the wall surface of the cup-shaped mounting component, an interconnection connected to the semiconductor light emitting element, etc. In contrast, in the embodiment, the resin liquid 68 is applied onto the flat workpiece 310 from which the growth substrate 5 has been removed, and then a concentration distribution of particles 64 is formed. Thus, in the embodiment, the thicknesses of the portion with a high concentration of particles 64 and the portion with a low concentration of particles 64 can be equalized, and the portions can be formed seamless.

Examples of the material in the embodiment will now be described.

For the first columnar unit 31 (e.g. the first metal column 31a and the first metal layer 31b) and the second columnar unit 32 (e.g. the second metal column 32a and the second metal layer 32b), for example, Cu (copper), Ni (nickel), Al (aluminum), and the like may be used.

For the resin unit 50, for example, an epoxy resin, a polyimide resin, or the like is used.

For the light transmissive resin 63, for example, a silicone resin and the like may be used. For the light transmissive resin 63, for example, methyl phenyl silicone with a refractive index of approximately 1.5 is used.

For the particle 64, for example, at least one of a red fluorescent substance, a green fluorescent substance, a blue fluorescent substance, and a yellow fluorescent substance may be used.

As the red fluorescent substance, the following is given, for example. However, the red fluorescent substance used in the embodiment is not limited to these.

$Y_2O_2S:Eu$,
$Y_2O_2S:Eu$+a pigment,
$Y_2O_3:Eu$,
$Zn_3(PO_4)_2:Mn$,
$(Zn, Cd)S:Ag+In_2O_3$,
$(Y, Gd, Eu)BO_3$,
$(Y, Gd, Eu)_2O_3$,
$YVO_4:Eu$
$La_2O_2S:Eu, Sm$,
$LaSi_3N_5:EU^{2+}$,
α-sialon:$Eu^{2+}$,
$CaAlSiN_3:Eu^{2+}$,
$CaSiN_x:Eu^{2+}$,
$CaSiN_x:Ce^{2+}$,
$M_2Si_5N_8:Eu^{2+}$,
$CaAlSiN_3:Eu^{2+}$,
$(SrCa)AlSiN_3:Eu^{x+}$, and
$Sr_x(Si_yAl_3)_z(O_xN):Eu^{x+}$.

As the green fluorescent substance, the following is given, for example. However, the green fluorescent substance used in the embodiment is not limited to these.

ZnS:Cu, Al,
ZnS:Cu, Al+a pigment,
(Zn, Cd)S:Cu, Al,
ZnS:Cu, Au, Al+a pigment,
$Y_3Al_5O_{12}:Tb$,
$Y_3(Al, Ga)_5O_{12}:Tb$,
$Y_2SiO_5:Tb$,
$Zn_2SiO_4:Mn$,
(Zn, Cd)S:Cu,
ZnS:Cu,
$Zn_2SiO_4:Mn$,
$ZnS:Cu+Zn_2SiO_4:Mn$,
$Gd_2O_2S:Tb$,
(Zn, Cd)S:Ag,
ZnS:Cu, Al,
$Y_2O_2S:Tb$,
$ZnS:Cu, Al+In_2O_3$,
$(Zn, Cd)S:Ag+In_2O_3$,
$(Zn, Mn)_2SiO_4$,
$BaAl_{12}O_{19}:Mn$,
$(Ba, Sr, Mg)O.aAl_2O_3:Mn$,
$LaPO_4:Ce, Tb$,
$Zn_2SiO_4:Mn$,
ZnS:Cu,
$3(Ba, Mg, Eu, Mn)O.8Al_2O_3$,
$La_2O_3.0.2SiO_2.0.9P_2O_5:Ce, Tb$,
$CeMgAl_{11}O_{19}:Tb$,
$CaSc_2O_4:Ce$,
$(BrSr)SiO_4:Eu$,
α-sialon:$Yb^{2+}$,
β-sialon:$Eu^{2+}$,
$(SrBa)YSi_4N_7:Eu^{2+}$,
$(CaSr)Si_2O_4N_7:Eu^{2+}$, and
Sr(SiAl)(ON):Ce.

As the blue fluorescent substance, the following is given, for example. However, the blue fluorescent substance used in the embodiment is not limited to these.

ZnS:Ag,
ZnS:Ag+a pigment,
ZnS:Ag, Al,
ZnS:Ag, Cu, Ga, Cl,
$ZnS:Ag+In_2O_3$,
$ZnS:Zn+In_2O_3$,
$(Ba, Eu)MgAl_{10}O_{17}$,
$(Sr, Ca, Ba, Mg)_{10}(PO_4)6Cl_2:Eu$,
$Sr_{10}(PO_4)6Cl_2:Eu$,
$(Ba, Sr, Eu)(Mg, Mn)Al_{10}O_{17}$,
$10(Sr, Ca, Ba, Eu).6PO_4.Cl_2$, and
$BaMg_2Al_{16}O_{25}:Eu$.

As the yellow fluorescent substance, the following is given, for example. However, the yellow fluorescent substance used in the embodiment is not limited to these.

$Li(Eu, Sm)W_2O_8$,
$(Y, Gd)_3, (Al, Ga)_5O_{12}:Ce^{3+}$,
$Li_2SrSiO_4:Eu^{2+}$,
$(Sr(Ca, Ba))_3SiO_5:Eu^{2+}$, and
$SrSi_2ON_{2.7}:Eu^{2+}$.

The embodiment can provide a semiconductor light emitting device with high light emission properties and high productivity and a method for manufacturing the same.

In the specification, "nitride semiconductor" includes all semiconductors expressed by the chemical formula of $B_xIn_y$ $Al_zGa_{1-x-y}N$ ($0 \le x \le 1$, $0 \le y \le 1$, $0 \le z \le 1$, $x+y+z \le 1$) in which the composition ratios x, y, and z are changed in the respective ranges. Furthermore, also those further including a group V element other than N (nitrogen) and those further including one of various dopants added in order to control the conductivity type etc. in the chemical formula mentioned above are included in the "nitride semiconductor."

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of semiconductor light emitting devices such as columnar units, optical layers, light emitting units, semiconductor layers, light emitting layers, resin units, resin layers, light transmissive resins, particles, fillers, resin liquids, metal columns, metal layers, and electrodes from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:
1. A method for manufacturing a semiconductor light emitting device comprising:
applying a resin liquid onto a first major surface of a workpiece, the workpiece having the first major surface and including a plurality of element units aligned in a plane parallel to the first major surface and a resin layer holding the plurality of element units, each of the plurality of element units including:
- a conductive first columnar unit extending in a first direction perpendicular to the first major surface;
- a conductive second columnar unit provided apart from the first columnar unit in a second direction parallel to the first major surface and extending in the first direction; and
- a light emitting unit including:
  - a first semiconductor layer of a first conductivity type including a first semiconductor portion opposed to at least part of the first columnar unit and a second semiconductor portion opposed to at least part of the second columnar unit;
  - a second semiconductor layer of a second conductivity type provided between the second columnar unit and the second semiconductor portion; and
  - a light emitting layer provided between the second semiconductor portion and the second semiconductor layer, the resin liquid including a light transmissive resin and a plurality of particles dispersed in the light transmissive resin and configured to absorb at least part of a first light emitted from the light emitting layer and emit a second light of a wavelength different from a wavelength of the first light;

causing the plurality of particles in the resin liquid to sink while keeping a state where a temperature of the workpiece on which the resin liquid is applied is raised to a first temperature and forming a first region on a surface side of the resin liquid and a second region provided between the first region and the workpiece and including the particle in a concentration higher than a concentration of the particle in the first region;

raising a temperature of the workpiece on which the first region and the second region are formed to a second temperature higher than the first temperature to cure the resin liquid to form an optical layer including a first portion and a second portion, the first portion being formed from the first region, the second portion being formed from the second region and including the particle at a concentration higher than a concentration of the particle in the first portion, there being no seam between the first portion and the second portion; and dividing the optical layer and the resin layer for the plurality of element units.

2. The method according to claim 1, wherein a thickness of the second portion is 200 micrometers or less.

3. The method according to claim 1, wherein the light transmissive resin includes at least one of a silicone-based resin, an acrylic-based resin, and an epoxy-based resin.

4. The method according to claim 1, wherein
the optical layer further includes a plurality of fillers dispersed in the light transmissive resin and
the filler includes at least one of silicon oxide, aluminum oxide, and titanium oxide.

5. The method according to claim 1, wherein
a concentration of the particle in the first portion is 5% or less and
a concentration of the particle in the second portion is not less than 40% and not more than 95%.

6. The method according to claim 1, wherein
a thickness of the first portion is not less than 20 micrometers and not more than 100 micrometers and the thickness of the second portion is 40 micrometers or more.

7. The method according to claim 1, wherein the thickness of the second portion is not less than 70 micrometers and not more than 80 micrometers.

8. A method for manufacturing a semiconductor light emitting device comprising:

disposing a structure body on a first major surface of a workpiece, the structure body lying along an edge of the first major surface, the workpiece having the first major surface and including a plurality of element units aligned in a plane parallel to the first major surface and a resin layer holding the plurality of element units, each of the plurality of element units including:
- a conductive first columnar unit extending in a first direction perpendicular to the first major surface;
- a conductive second columnar unit provided apart from the first columnar unit in a second direction parallel to the first major surface and extending in the first direction; and
- a light emitting unit including:
  - a first semiconductor layer of a first conductivity type including a first semiconductor portion opposed to at least part of the first columnar unit and a second semiconductor portion opposed to at least part of the second columnar unit;
  - a second semiconductor layer of a second conductivity type provided between the second columnar unit and the second semiconductor portion; and
  - a light emitting layer provided between the second semiconductor portion and the second semiconductor layer;

applying a resin liquid onto a region surrounded by the structure body of the first major surface, the resin liquid including a light transmissive resin and a plurality of particles dispersed in the light transmissive resin and configured to absorb at least part of a first light emitted from the light emitting layer and emit a second light of a wavelength different from a wavelength of the first light;

applying centrifugal force to the workpiece on which the resin liquid is applied and changing a distribution of the plurality of particles in the resin liquid to form a first region on a surface side of the resin liquid and a second region provided between the first region and the workpiece and including the particle at a concentration higher than a concentration of the particle in the first region;

curing the resin liquid to form an optical layer including a first portion and a second portion, the first portion being formed from the first region, the second portion being formed from the second region and including the particle at a concentration higher than a concentration of the particle in the first portion, there being no seam between the first portion and the second portion; and dividing the optical layer and the resin layer for the plurality of element units, wherein a thickness of the second portion is 200 micrometers or less.

9. The method according to claim 8, wherein the light transmissive resin includes at least one of a silicone-based resin, an acrylic-based resin, and an epoxy-based resin.

10. The method according to claim 8, wherein
the optical layer further includes a plurality of fillers dispersed in the light transmissive resin and
the filler includes at least one of silicon oxide, aluminum oxide, and titanium oxide.

11. The method according to claim 8, wherein
a concentration of the particle in the first portion is 5% or less and
a concentration of the particle in the second portion is not less than 40% and not more than 95%.

12. The method according to claim 8,
wherein the thickness of the second portion is not less than 70 micrometers and not more than 80 micrometers.

13. A method for manufacturing a semiconductor light emitting device comprising:
disposing a structure body on a first major surface of a workpiece, the structure body lying along an edge of the first major surface,
the workpiece having the first major surface and including a plurality of element units aligned in a plane parallel to the first major surface and a resin layer holding the plurality of element units,
each of the plurality of element units including:
a conductive first columnar unit extending in a first direction perpendicular to the first major surface;
a conductive second columnar unit provided apart from the first columnar unit in a second direction parallel to the first major surface and extending in the first direction; and
a light emitting unit including:
a first semiconductor layer of a first conductivity type including a first semiconductor portion opposed to at least part of the first columnar unit and a second semiconductor portion opposed to at least part of the second columnar unit;
a second semiconductor layer of a second conductivity type provided between the second columnar unit and the second semiconductor portion; and
a light emitting layer provided between the second semiconductor portion and the second semiconductor layer;
applying a resin liquid onto a region surrounded by the structure body of the first major surface, the resin liquid including a light transmissive resin and a plurality of particles dispersed in the light transmissive resin and configured to absorb at least part of a first light emitted from the light emitting layer and emit a second light of a wavelength different from a wavelength of the first light;
applying centrifugal force to the workpiece on which the resin liquid is applied and changing a distribution of the plurality of particles in the resin liquid to form a first region on a surface side of the resin liquid and a second region provided between the first region and the workpiece and including the particle at a concentration higher than a concentration of the particle in the first region;
curing the resin liquid to form an optical layer including a first portion and a second portion, the first portion being formed from the first region, the second portion being formed from the second region and including the particle at a concentration higher than a concentration of the particle in the first portion, there being no seam between the first portion and the second portion; and
dividing the optical layer and the resin layer for the plurality of element units,
wherein a thickness of the first portion is not less than 20 micrometers and not more than 100 micrometers and
the thickness of the second portion is 40 micrometers or more.

14. A semiconductor light emitting device comprising:
a conductive first columnar unit extending in a first direction;
a conductive second columnar unit provided apart from the first columnar unit in a second direction crossing the first direction and extending in the first direction;
an optical layer provided apart from the first columnar unit and the second columnar unit in the first direction;
a light emitting unit including:
a first semiconductor layer of a first conductivity type including:
a first semiconductor portion provided between at least part of the first columnar unit and the optical layer; and
a second semiconductor portion provided between the second columnar unit and the optical layer;
a second semiconductor layer of a second conductivity type provided between the second columnar unit and the second semiconductor portion; and
a light emitting layer provided between the second semiconductor portion and the second semiconductor layer; and
a resin unit covering a side surface along the first direction of the first columnar unit, a side surface along the first direction of the second columnar unit, a side surface of the light emitting unit, and a surface on a side of the first columnar unit and the second columnar unit of the light emitting unit,
the optical layer including a light transmissive resin and a plurality of particles dispersed in the light transmissive resin and configured to absorb at least part of a first light emitted from the light emitting layer and emit a second light of a wavelength different from a wavelength of the first light,
the optical layer including a first portion and a second portion provided between the first portion and the first semiconductor layer and including the particle at a concentration higher than a concentration of the particle in the first portion,
there being no seam between the first portion and the second portion,
wherein a thickness of the second portion is 200 micrometers or less.

15. The device according to claim 14, wherein the light transmissive resin contains includes at least one of a silicone-based resin, an acrylic-based resin, and an epoxy-based resin.

16. The device according to claim 14,
wherein the thickness of the second portion is not less than 70 micrometers and not more than 80 micrometers.

17. A semiconductor light emitting device comprising:
a conductive first columnar unit extending in a first direction;
a conductive second columnar unit provided apart from the first columnar unit in a second direction crossing the first direction and extending in the first direction;
an optical layer provided apart from the first columnar unit and the second columnar unit in the first direction;
a light emitting unit including:
a first semiconductor layer of a first conductivity type including:
a first semiconductor portion provided between at least part of the first columnar unit and the optical layer; and
a second semiconductor portion provided between the second columnar unit and the optical layer;
a second semiconductor layer of a second conductivity type provided between the second columnar unit and the second semiconductor portion; and a light emitting layer provided between the second semiconductor portion and the second semiconductor layer; and a resin unit covering a side surface along the first direction of the first columnar unit, a side surface along the first direction of the second columnar unit, a side surface of the light emitting unit, and a surface on a side of the first columnar unit and the second columnar unit of the light emitting unit, the optical layer including a light transmissive resin and a plurality of particles dispersed in the light transmissive resin and configured to absorb at least part of a first light emitted from the light emitting layer and emit a second light of a wavelength different from a wavelength of the first light, the optical layer including a first portion and a second portion provided between the first portion and the first semiconductor layer and including the particle at a concentration higher than a concentration of the particle in the first portion, there being no seam between the first portion and the second portion, wherein a concentration of the particle in the first portion is 5% or less and more than 0%, and a concentration of the particle in the second portion is not less than 40% and not more than 95%.

18. A semiconductor light emitting device comprising:

a conductive first columnar unit extending in a first direction;

a conductive second columnar unit provided apart from the first columnar unit in a second direction crossing the first direction and extending in the first direction;

an optical layer provided apart from the first columnar unit and the second columnar unit in the first direction;

a light emitting unit including:
- a first semiconductor layer of a first conductivity type including:
  - a first semiconductor portion provided between at least part of the first columnar unit and the optical layer; and
  - a second semiconductor portion provided between the second columnar unit and the optical layer;
- a second semiconductor layer of a second conductivity type provided between the second columnar unit and the second semiconductor portion; and
- a light emitting layer provided between the second semiconductor portion and the second semiconductor layer; and a resin unit covering a side surface along the first direction of the first columnar unit, a side surface along the first direction of the second columnar unit, a side surface of the light emitting unit, and a surface on a side of the first columnar unit and the second columnar unit of the light emitting unit, the optical layer including a light transmissive resin and a plurality of particles dispersed in the light transmissive resin and configured to absorb at least part of a first light emitted from the light emitting layer and emit a second light of a wavelength different from a wavelength of the first light, the optical layer including a first portion and a second portion provided between the first portion and the first semiconductor layer and including the particle at a concentration higher than a concentration of the particle in the first portion, there being no seam between the first portion and the second portion, wherein a thickness of the first portion is not less than 20 micrometers and not more than 100 micrometers and a thickness of the second portion is 40 micrometers or more.

* * * * *